(12) United States Patent
Liu et al.

(10) Patent No.: US 10,262,992 B2
(45) Date of Patent: Apr. 16, 2019

(54) THREE DIMENSIONAL LVDMOS TRANSISTOR STRUCTURES

(71) Applicant: AVAGO TECHNOLOGIES INTERNATIONAL SALES PTE. LIMITED

(72) Inventors: Qing Liu, Irvine, CA (US); Shom Ponoth, Irvine, CA (US); Akira Ito, Irvine, CA (US)

(73) Assignee: AVAGO TECHNOLOGIES INTERNATIONAL SALES PTE. LIMITED, Singapore (SG)

(*) Notice: Subject to any disclaimer, the term of this patent is extended or adjusted under 35 U.S.C. 154(b) by 0 days.

(21) Appl. No.: 15/472,585

(22) Filed: Mar. 29, 2017

(65) Prior Publication Data
US 2018/0286858 A1    Oct. 4, 2018

(51) Int. Cl.
| | |
|---|---|
| H01L 29/80 | (2006.01) |
| H01L 27/06 | (2006.01) |
| H01L 29/08 | (2006.01) |
| H01L 29/06 | (2006.01) |
| H01L 29/788 | (2006.01) |
| H01L 29/423 | (2006.01) |
| H01L 29/78 | (2006.01) |

(52) U.S. Cl.
CPC ...... *H01L 27/0688* (2013.01); *H01L 29/0649* (2013.01); *H01L 29/0878* (2013.01); *H01L 29/0882* (2013.01); *H01L 29/42324* (2013.01); *H01L 29/7803* (2013.01); *H01L 29/788* (2013.01); *H01L 29/7817* (2013.01)

(58) Field of Classification Search
CPC ............ H01L 27/0688; H01L 29/0649; H01L 29/0878; H01L 29/0882; H01L 29/41783; H01L 29/42324; H01L 29/7803; H01L 29/7817; H01L 29/788; G05F 3/242
USPC ........................................................ 257/278
See application file for complete search history.

(56) References Cited

U.S. PATENT DOCUMENTS

| | | | | |
|---|---|---|---|---|
| 3,819,952 A | * | 6/1974 | Enomoto ................ | H03F 1/523 257/360 |
| 5,151,759 A | * | 9/1992 | Vinal ................... | H01L 29/4916 257/348 |
| 6,014,018 A | * | 1/2000 | Wu ........................ | G05F 3/242 323/265 |
| 2016/0211367 A1 | * | 7/2016 | Ito ....................... | H01L 29/7824 |

* cited by examiner

*Primary Examiner* — Tu-Tu V Ho
(74) *Attorney, Agent, or Firm* — Xsensus/Broadcom

(57) ABSTRACT

A semiconductor device having a first stack and a second stack of device components. The first stack has a transistor switching element having a channel, a source in contact with the channel, a drain in contact with the channel, and a gate structure at least partially disposed in a space defined between and separating the source and the drain. The first stack has a source connection to the source, and a drain connection to the drain. The second stack of device components is disposed underneath the first stack and has a semiconductor substrate of a doping type the same as the drain, and a pair of electrical contacts spaced apart on the semiconductor substrate and contacting a conduction path in the semiconductor substrate extending between the pair of electrical contacts. The drain connection is connected to one of the pair of electrical contacts.

19 Claims, 16 Drawing Sheets

4)

5A)

5B)

5C)

24)

26)

THREE DIMENSIONAL LVDMOS TRANSISTOR STRUCTURES

BACKGROUND OF THE INVENTION

Field of Invention

The invention relates to three dimensional vertically stacked transistor structures.

Discussion of the Background

Rapid advances in electronics and communication technologies, driven by immense customer demand, have resulted in the widespread adoption of electronic devices of every kind. The transistor is a fundamental circuit component of almost all of these devices. Transistors have a wide range of circuit applications. Laterally Diffused MOSFET (LDMOS) transistors for instance provide a key building block for radio frequency power amplifiers. An LDMOS is an asymmetric power MOSFET designed for low on-resistance and high blocking voltage. These features are obtained by creating a diffused p-type channel region in a low-doped n-type drain region. The low doping on the drain side results in a large depletion layer with a relatively high blocking voltage.

Improvements in transistor design will improve the implementation and performance of many different types of circuits that rely on LDMOS transistors.

SUMMARY OF THE INVENTION

In one embodiment, there is provided a semiconductor device having a first stack and a second stack of device components. The first stack has a transistor switching element having a channel, a source in contact with the channel, a drain in contact with the channel, and a gate structure at least partially disposed in a space defined between and separating the source and the drain. The first stack has a source connection to the source, and a drain connection to the drain. The second stack of device components is disposed underneath the first stack and has a semiconductor substrate of a doping type the same as the drain, and a pair of electrical contacts spaced apart on the semiconductor substrate and contacting a conduction path in the semiconductor substrate extending between the pair of electrical contacts. The drain connection is connected to one of the pair of electrical contacts.

In another embodiment, there is provided a structure for reducing a drain side voltage at a drain of a MOSFET transistor. The structure has a voltage attenuation structure connected in series with the drain, disposed apart from the channel region of the MOSFET transistor in a separate semiconductor substrate, and comprising a pair of electrical contacts spaced apart on the semiconductor substrate and forming electrical contacts to a conduction path in the semiconductor substrate extending between the pair of electrical contacts.

In another embodiment, there is provided a method for operating a MOSFET transistor at a reduced drain side voltage. The method supplies control voltages to a drain and a gate of a transistor switching element of the MOSFET transistor. The method, when the MOSFET transistor is on, conducts drain current through a semiconductor substrate disposed apart from the channel region of the MOSFET transistor and then to said drain of the transistor switching element.

It is to be understood that both the foregoing general description of the invention and the following detailed description are exemplary, but are not restrictive of the invention.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
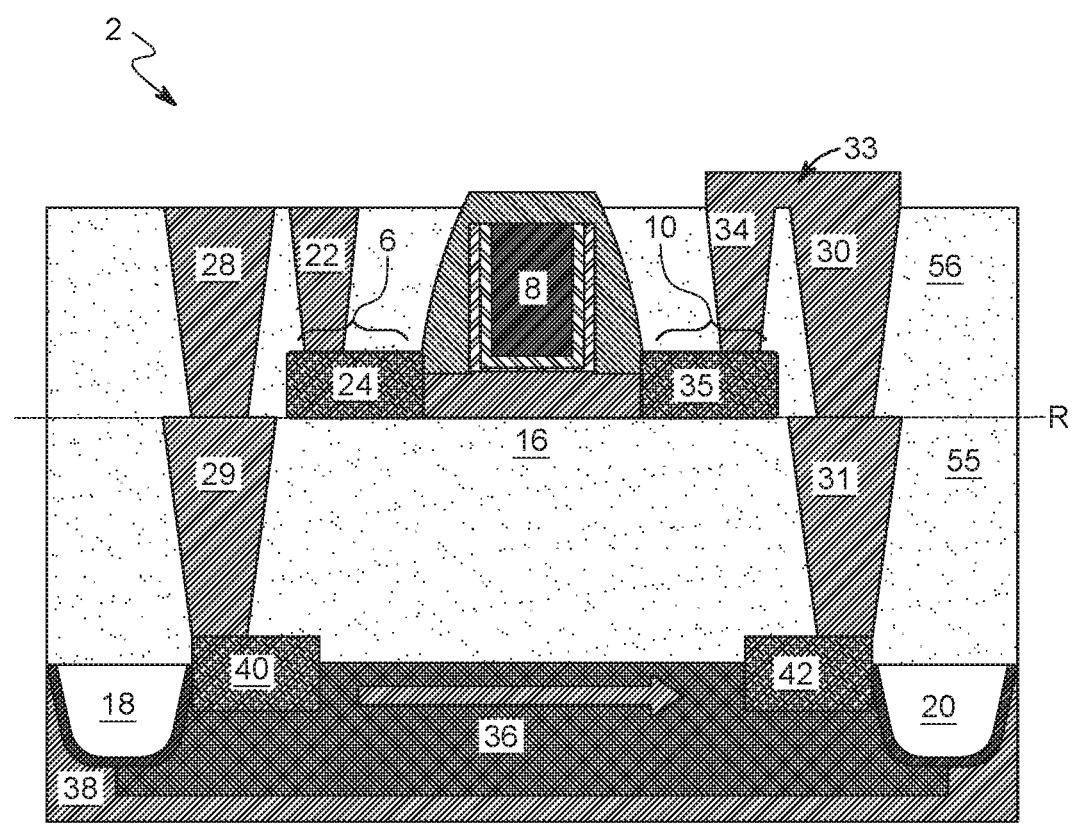
FIG. 1 is a schematic showing a three dimensional Laterally and Vertically Distributed MOSFET (LVDMOS) transistor structure of the present invention having a drain structure vertically disposed underneath the gate and channel of the transistor.

Reference will now be made in detail to the present preferred embodiment of the invention, an example of which is illustrated in the accompanying drawings, in which like reference characters refer to corresponding elements.

A three dimensional LVDMOS transistor of the present invention provides a drain structure vertically disposed underneath the gate and channel of the transistor. Displacing the drain structure vertically, out of the plane of the gate and channel creates a three dimensional structure for the transistor. In the present invention, the top transistor in the top section (top stack) includes a transport channel, and the bottom section (bottom stack) includes a laterally distributed drain (LDD) component.

U.S. Pat. Appl. No. 2016/0351710 (the entire contents of which are incorporated herein by reference) provided for a drain structure vertically disposed above (not underneath) the gate and channel of the transistor. In the '710 configuration, the bottom section of the transistor included the transport channel, and the top section included a laterally distributed drain (LDD) component. One result of either configuration is that the transistors in each configuration consume far less lateral area on the substrate as compared to a conventional laterally diffused MOSFET (LDMOS). Although the '710 configuration has an area efficiency, the on resistance ($R_{on}$) will be relatively high because of the relatively thin conduction path in the top section. This higher on resistance is disadvantageous in low power applications.

Exemplary Embodiments

FIG. 1 shows an example of a vertically stacked LVDMOS transistor structure of the present invention having a drain structure vertically disposed underneath the gate and channel of the transistor. The configuration and operation of the vertically stacked LVDMOS transistor structure is described below to provide an understanding of the relative components and their function in this invention.

In the cross sectional view of FIG. 1, the transistor 2 includes a source structure 6, a gate structure 8, and a drain structure 10. The transistor 2 can be fabricated, in this example, with fully depleted silicon on insulator (FDSOI) planar processing technology. In this case, a relatively thin silicon layer 16 exists as the channel for transistor 2. For example, the thickness of the silicon layer 16 is less than 100 nm thick. In other examples, the thickness of the silicon layer 16 is preferably less than 50 nm thick or less than 20 nm thick. The transistor 2 can be a partially depleted transistor. In this case, silicon layer 16 is preferably 1 to 100 microns thick. Regardless of the thickness and the channel would be un-doped or have an opposite doping to the source drain and the gate voltage would induce high doping type as of source drain in an upper level of the channel, thereby turning on the transistor.

The source structure 6 includes a metallization connection 22 and raised source/drain (RSD) structure 24. The metallization connection 22 may include a source terminal or other source signal connection for electrical connection. The gate structure 8 may be a high-k metal gate or Poly SiON gate, or any other type of transistor gate structure that creates a channel 16 between the source structure 6 and the drain structure 10.

The drain structure shown in FIG. 1 can include metallization connections 28, 29, 30, 31, 33, and 34, the RSD structures 24, 35, 40, 42, and a voltage attenuation structure 36. The metallization connection 28/29 as shown provide a drain terminal or other drain signal connection for transistor 2 to one end of the voltage attenuation structure 36. In this example, the voltage attenuation structure 36 is a lightly doped region in the underlying substrate 38. The lightly doped region can have a doping concentration of $1-10\times10^{18}$ atoms per cm$^3$ or lower. At each end of the lightly doped region of substrate 38 are highly doped regions 24, 35, 40 and 42 (doping concentrations of $1-5\times10^{20}$ atoms per cm$^3$ or higher) which reduce contact resistance and voltage drop between the metallizations 29, 31 and the lightly doped region of substrate 38. Shallow trench isolations 18 and 20 can be used to separate the voltage attenuation structure 36 from neighboring devices (e.g., additional voltage attenuation structures formed on the same substrate 38). Metallizations 28, 29 can be the same metallization material and may be deposited at the same time filling the lower level first. Metallizations 30, 31 can be the same metallization material and may be deposited at the same time filling the lower level first. Metallizations 28, 29, 30, 31 may be the same metallization material and may be deposited at the same time filling the lower levels first.

The structures of transistor 2 are formed at different levels (e.g., as part of different semiconductor component stacks). FIG. 1 shows a reference line R to illustrate the vertically disposed nature of these structures. In particular, the first level (i.e., below reference line R) includes the drain structure with the voltage attenuation structure 36. In the first level, there are metallizations 29 and 31 which connected upward to second level (i.e., above reference line R). The second level includes the source structure 6, the gate structure 8, and the drain structure 10. In this architecture, the top stack includes the transport channel, and the bottom stack includes components of the laterally diffused drain (i.e., of the voltage attenuation structure 36). Hence, transistor 2 shown in FIG. 1 is a three dimensional structure in the sense that a portion of the drain structure is vertically displaced. In the particular example of FIG. 1, the voltage attenuation structure 36 is vertically positioned at a level (or in a stack) below gate 8.

In some implementations, the vertical distance between reference line R and the top of the voltage attenuation structure 36 is between 30 nm and 100 nm, e.g., 50 nm. However, many different vertical displacements are possible. The first level (below reference line R) may be fabricated with a standard CMOS fabrication process. The second level (above reference line R) may be fabricated using a lower temperature CMOS fabrication process, e.g. with temperature below 600 degrees. That is, the entire transistor structure 2 may be fabricated into two stacks of semiconductor components, each stack created with a separate fabrication process.

Figure 2:
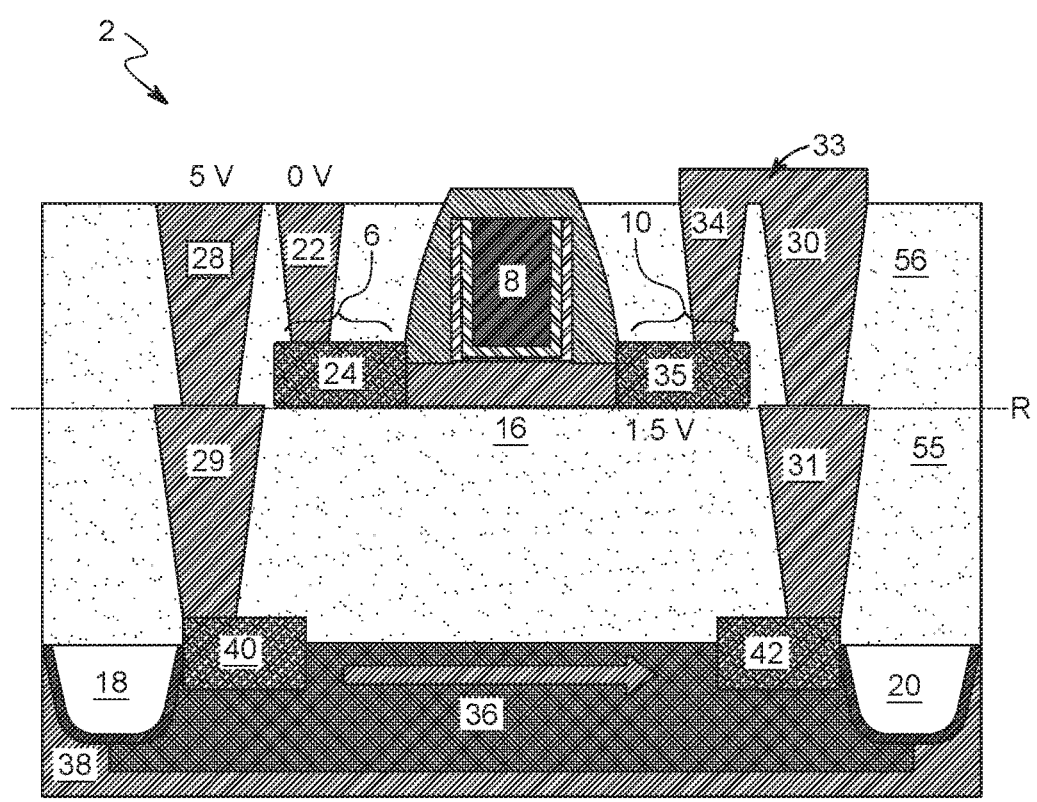
FIG. 2 is a schematic showing an example of the three dimensional LVDMOS transistor of FIG. 1 with exemplary operational voltages shown.

FIG. 2 shows a configuration where the resistance of drain path (including metallization connections 28, 29, 30, 31, 32, 33, and 34, the RSD structures 24, 35, 40, 42, and a voltage attenuation structure 36) is higher than the channel resistance. The formation in the present invention of the voltage attenuation structure 36 in a lightly doped region of semiconductor substrate 38 means that the on resistance is significantly lowered as compared to the '701 configuration.

As shown in FIG. 2, a 5 V drain signal or higher at the drain terminal can be dropped via the voltage attenuation structure 36, to approximately 1.5 V. The voltage attenuation structure 36 acts as a relatively higher resistance resistor than the drain metallizations, while providing carriers for conducting current. Accordingly, a voltage applied to the drain will drop in voltage before it appears on the right side of the drain to channel 16. Even when the gate is off (0 V), the voltage at RSD 35 can be less than the nominal gate voltage. Thus, the voltage in the drain region near the gate 8 is kept similar to the gate voltage (e.g., 1.5 V to 1.8 V), which increases the break down voltage and prevents catastrophic damage to the gate, while providing an overdrive voltage for current. For advanced designs, the gate voltage is typically around 1.8 V (for example between 1.5 and 1.8 V).

Due to the three dimensional structure with the voltage attenuation structure 36 below the upper transistor structures, no additional lateral footprint is needed for an extended drain structure of the voltage attenuation structure 36. One result is that the transistor 2 consumes far less lateral area on the substrate 38, and that in turn permits transistors to be more densely arranged on substrate 38, and permits additional devices of the same or other types to be formed on the substrate 38 adjacent the transistor 2. Indeed, by utilizing the top transistor for conduction channel and bottom layer for drain diffusion, a high area efficiency and low turn on resistances $R_{on}$ can be achieved. The area saving can range from 30~60% depending on the attenuation voltage required. The $R_{on}$ can be one-fifth or lower than when utilizing the top thin Si layer as the voltage attenuation path.

In one embodiment of the present invention, the upper transistor can operated with a thin, fully depleted channel 16, leading to better electrostatics (lower swing and drain induced barrier lowering DIBL) for the upper transistor. RSDs 24 and 35 can be highly doped regions formed by implantation or in-situ doped epitaxial layer.

Figure 3:
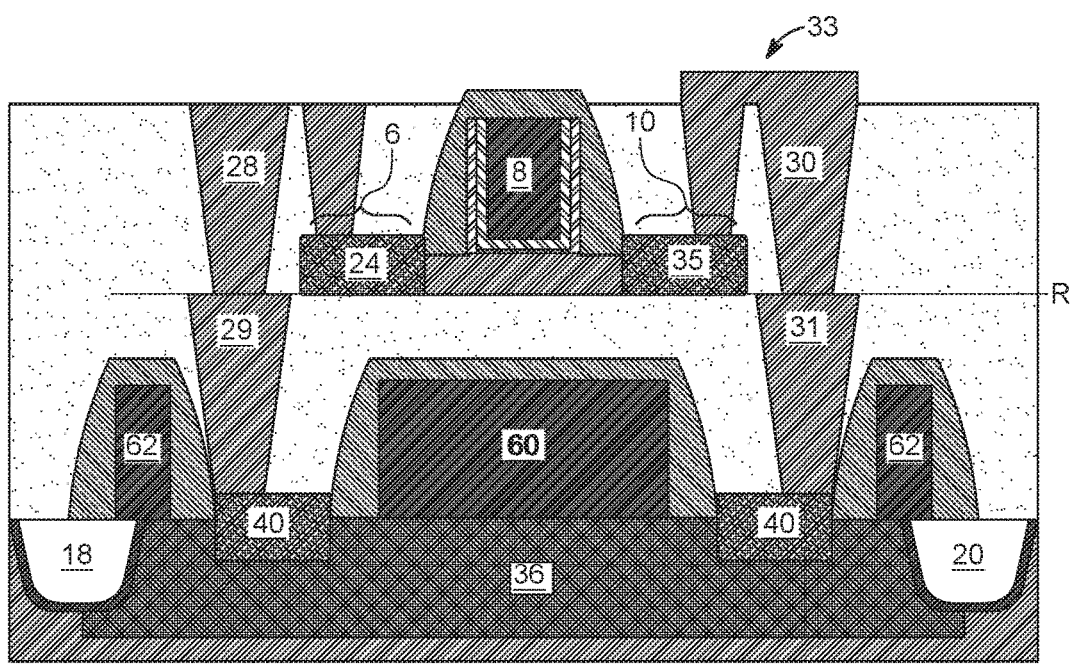
FIG. 3 is a schematic showing a three dimensional LVDMOS transistor of the present invention, shown in a cross sectional view, with a dummy gate structure above the low resistance drain region.

FIG. 3 shows a three dimensional LVDMOS transistor 2 of the present invention (shown in a cross sectional view) with a drain structure vertically disposed underneath the gate and channel of the transistor, as in FIG. 1. Here, in this embodiment, a dummy gate 60 is included above the lightly doped region of substrate 38. In some foundries, the active region of semiconductor substrate 38 has to be either N-type or P-type. In this case, dummy gate 60 helps ensure the existence of a lightly doped region for the voltage attenuation structure 36 as dummy gate 60 can fully deplete charges from a region under the dummy gate that is part of the drain side conduction path. In another embodiment, supplemental dummy gates 62 are included between the RSDs 40/42 and the shallow trench isolations 18/20. Both dummy gate 60 and supplemental dummy gates 62 can be floating gates.

Figure 4:
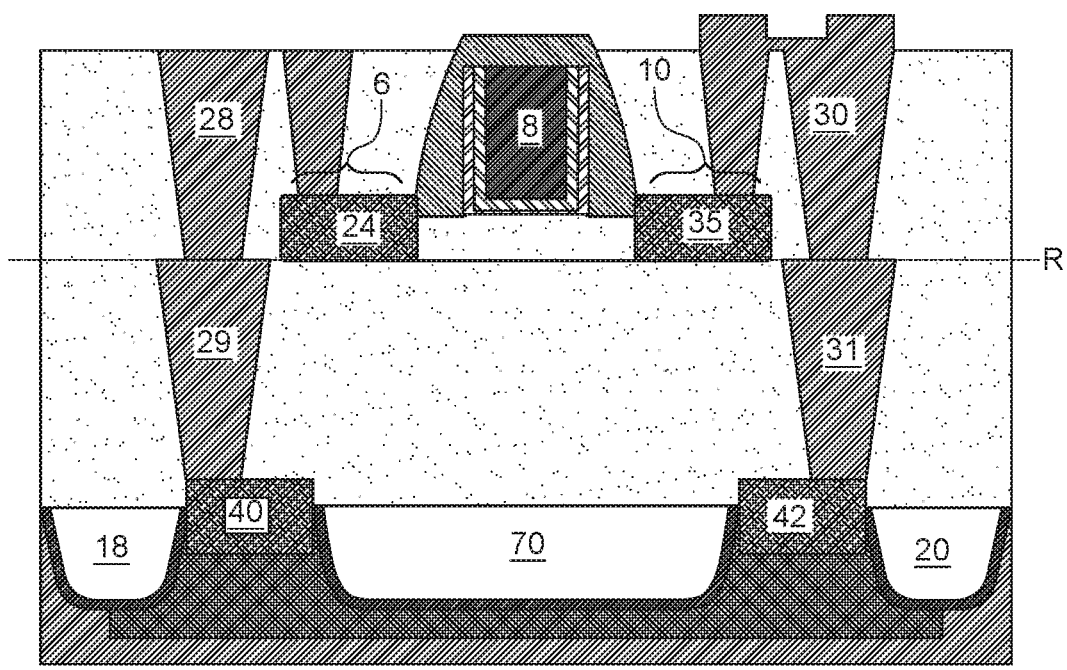
FIG. 4 is a schematic showing a three dimensional LVDMOS transistor of the present invention including a shallow trench insulator region in a low resistance drain region.

FIG. 4 shows a three dimensional LVDMOS transistor 2 of the present invention (shown in a cross sectional view) with a drain structure vertically disposed underneath the gate and channel of the transistor, as in FIG. 1. Here, in this embodiment, a shallow trench isolation (STI) region 70 is included in between RSDs 40/42. By inserting STI 70 into the bottom layer, the area needed for LVDMOS to have the voltage drop from A to B is further reduced as current flow between RSDs 40 and 42 has to pass under STI 70. Compared with the configuration shown in FIG. 1, the configuration of FIG. 4 can withstand higher drain voltage, with only a limited increase of the turn on resistance $R_{on}$. With the same A to B length, the voltage attenuation path now follows the STI profile, resulting in longer effective distance and larger voltage drop. Due to the depth of the lightly doped region, the increase of $R_{on}$ is limited.

Figure 5:
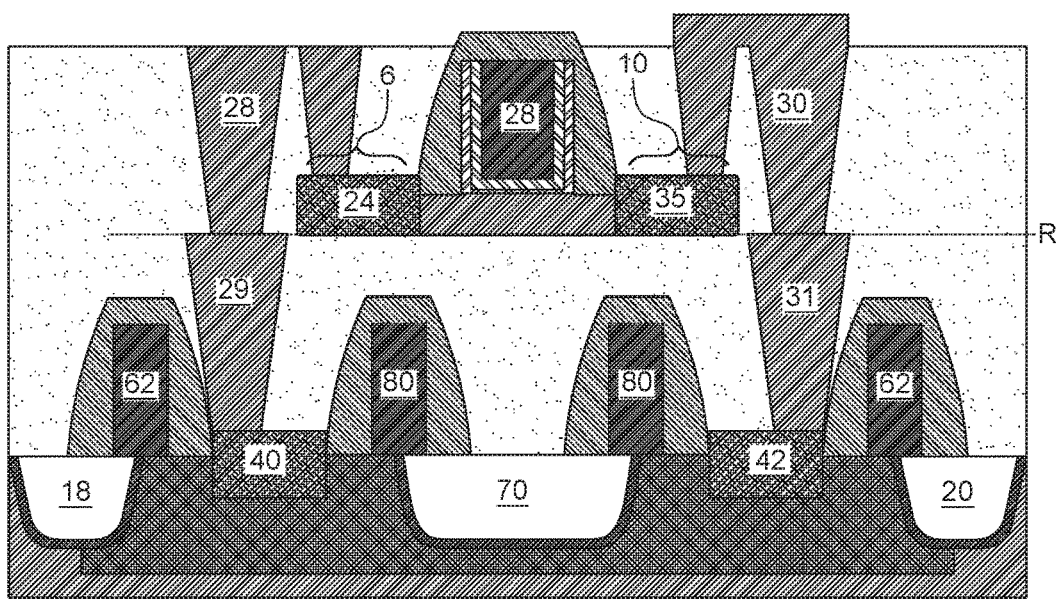
FIG. 5 is a schematic showing the three dimensional LVDMOS transistor of FIG. 4 with auxiliary dummy gates included around the shallow trench insulator region.

FIG. 5 shows a three dimensional LVDMOS transistor 2 of the present invention (shown in a cross sectional view) with a drain structure vertically disposed underneath the gate and channel of the transistor, as in FIG. 4. Here, in this embodiment, supplemental dummy gates 62 are included between the RSDs 40/42 and the shallow trench isolations 18/20, and auxiliary dummy gates 80 are included between the RSDs 40/42 and the shallow trench isolation 70. Both supplemental dummy gates 62 and auxiliary dummy gates 80 can be floating gates.

The embodiments above provide for a novel device architecture using three-dimensional transistor structures which are compatible with CMOS technologies, such as FinFET, FDSOI and Bulk, and also which will be compatible with nano-wire/nano-sheet based CMOS platforms (as these technology platforms emerge). By having the voltage attenuation structure in bulk region of a semiconductor wafer, there is more flexibility in the design to engineer a proper resistance for the voltage attenuation structure 36, than there was with the '701 configuration.

Figure 6:
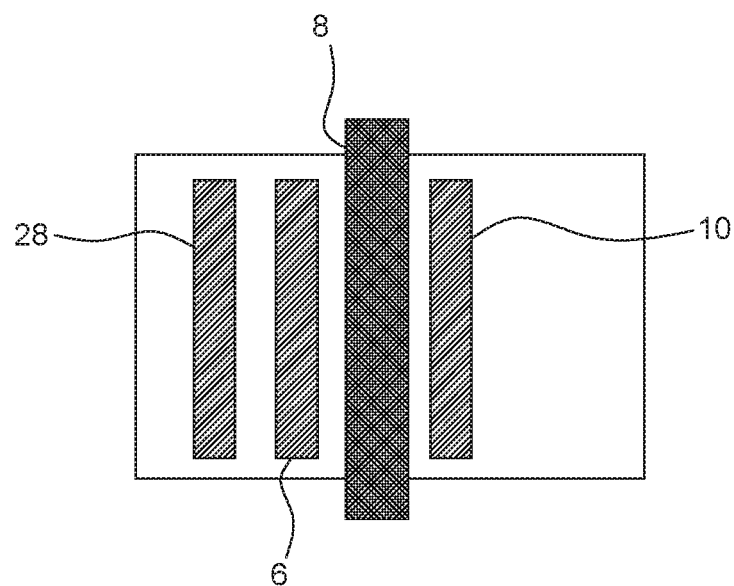
FIG. 6 is a schematic showing top views of the three dimensional LVDMOS transistor.
Figure 6:
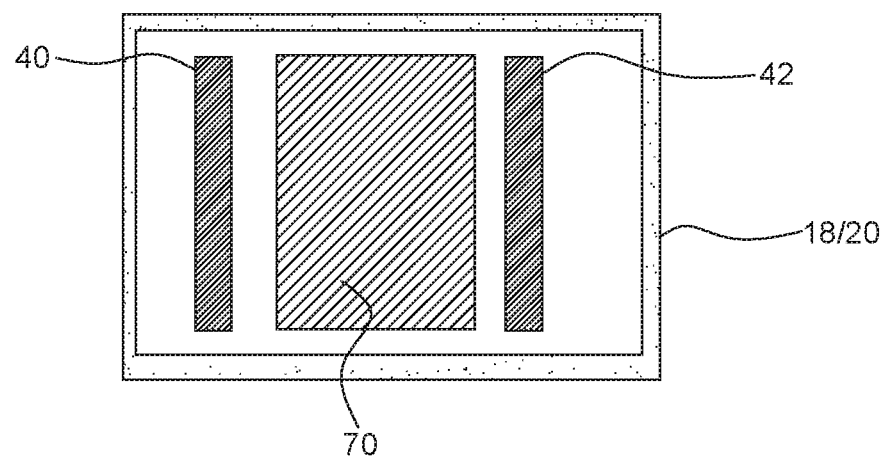

FIG. 6 is a top view showing an exemplary layout of the components of the vertically stacked LVDMOS transistor structure of the present invention discussed above. FIG. 6 shows components of the upper stack (including source structure 6, gate structure 8, and drain structure 10). FIG. 6 shows components of the lower stack (including RSD 40/42 and STI 70). A conduction path extends laterally across and under the surface of substrate 38 from between the RSD 40 to RSD 42. This path may a resistance which is 0.5 to 3-times the resistance of channel 26 when the channel is turned on.

Fabrication Procedures

FIGS. 7A-7F show various fabrication steps for making a three dimensional LVDMOS transistor of the present invention. Although alternate steps are possible, in this first exemplary process, the fabrication process begins at step 1) with substrate 38 having a top surface region of an n-type or p-type conductivity matching that of the conductivity of the drain structure 10 in which are fabricated STIs 18 and 20, as shown in FIG. 1. The steps of a STI process involve etching a pattern of trenches in the silicon wafer, depositing one or more dielectric materials (such as silicon dioxide) to fill the trenches, and removing the excess dielectric using a technique such as chemical-mechanical planarization. The shallow trenches of STIs 18 and 20 serve to confine drain path 28 to a region between RSD 40 and RSD 42. At this point, if needed, STI 70 can be formed between RSD 40 and RSD 42. In which case, the conduction path will extend under STI 70 to thereby increase the resistance in the drain conduction path. U.S. Pat. No. 6,784,077 (the entire contents of which are incorporated herein by reference) describes a shallow trench isolation process fabrication process suitable for the present invention, but other known STI processes can be used.

Figure 7A:
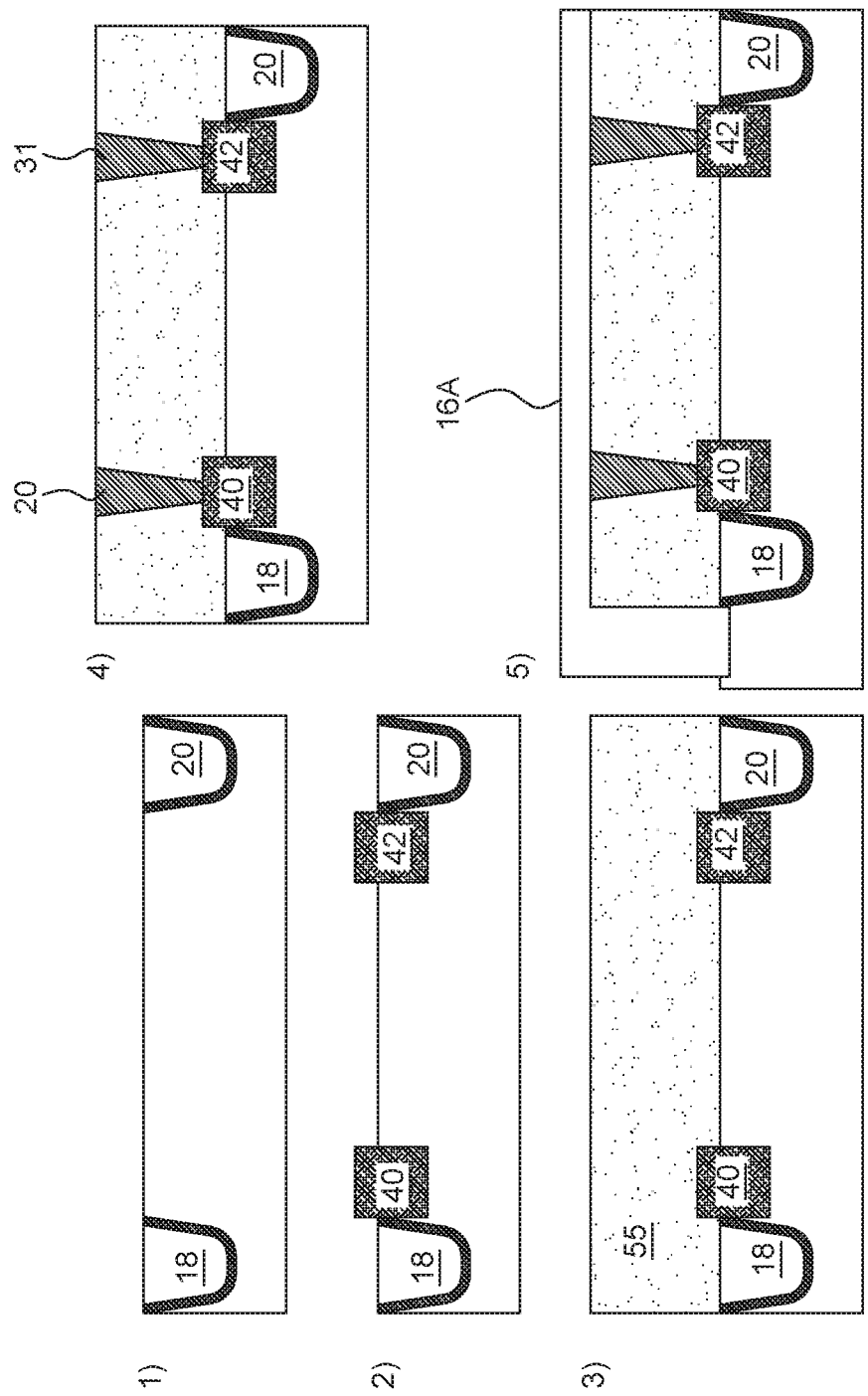
FIGS. 7A-7D are schematics showing a fabrication process for a three dimensional monolithic LVDMOS transistor.
Figure 7B:
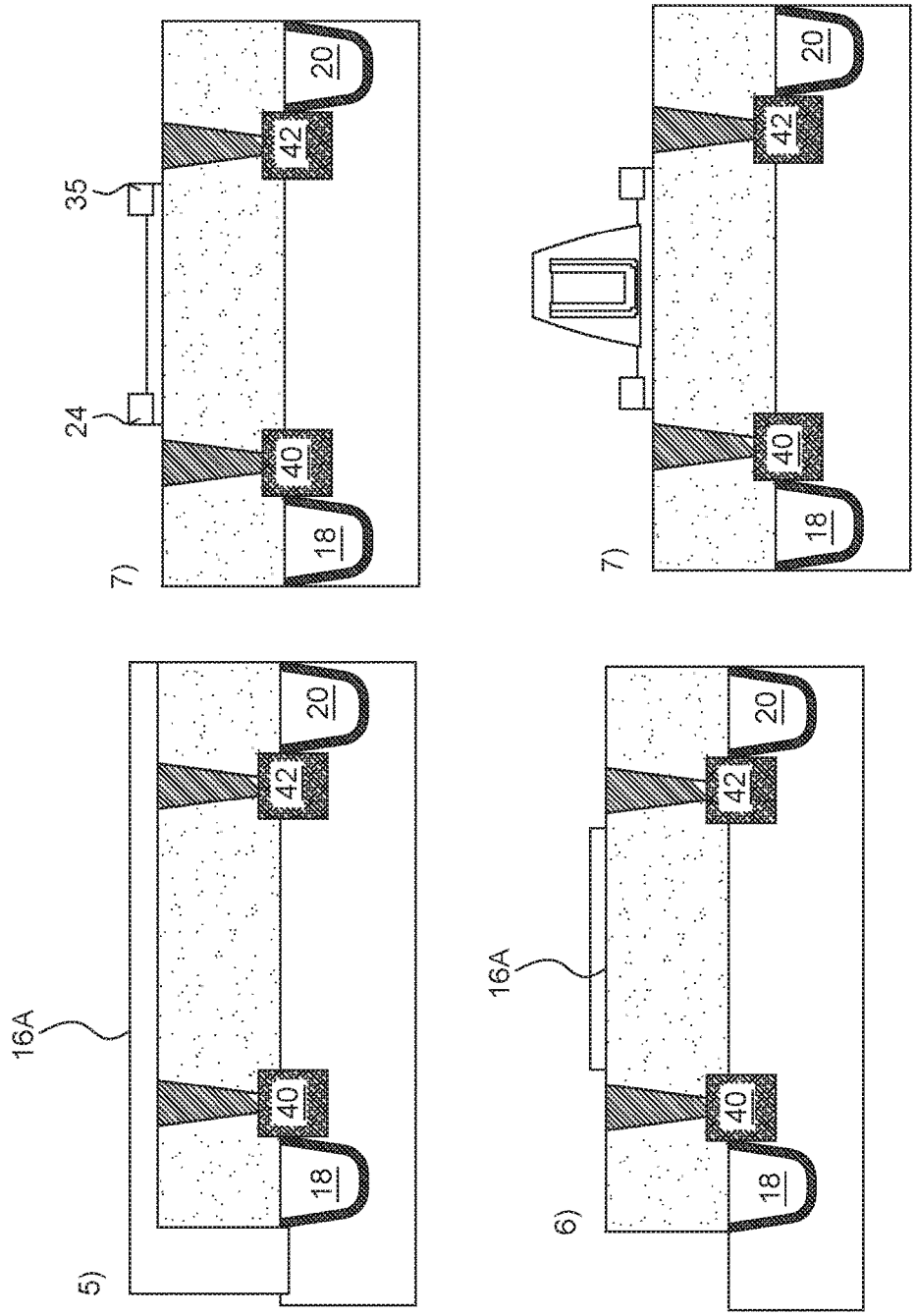
Figure 7C:
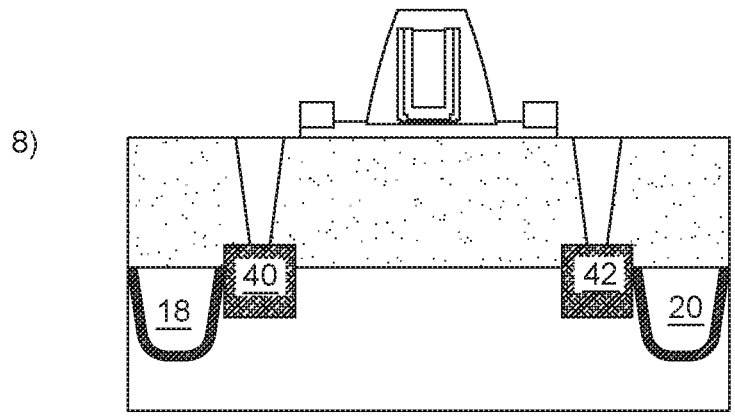
Figure 7C:
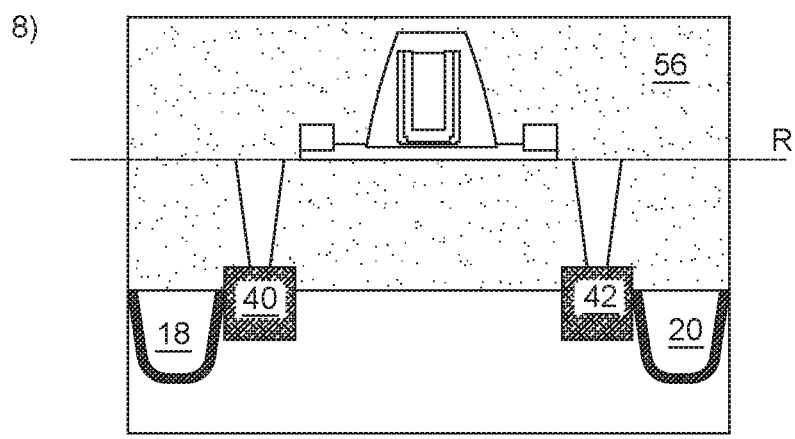
Figure 7D:
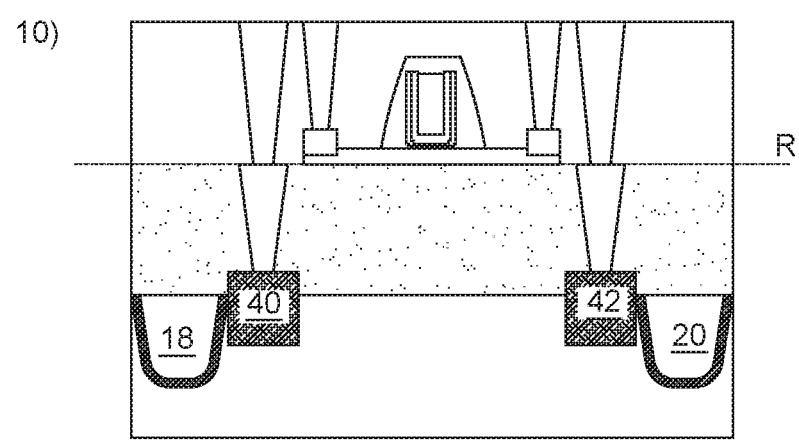

As shown in FIG. 7A, at step 2), adjacent to the STIs 18 and 20 are formed RSD 40 and RSD 42 (or other surface contacts). Raised source drain contacts can be formed by deposition of heavily doped single crystal silicon or silicon-germanium (SiGe) selectively on substrate 38. Raised source drain contacts are preferably doped of a type and to a level which makes for a low resistance ohmic contact to metallizations. Although shown as raised source drain contacts, these contacts can be formed by diffusion or ion implantation into the surface of the substrate 38 and can be level with the surface of substrate 38. In one embodiment of the present invention, the semiconductor material of the various raised source/drain regions is single crystalline. In some implementations of the present invention, the raised source drain contacts have doping levels approximately $1-5\times10^{20}$ atoms per $cm^3$ or higher.

U.S. Pat. No. 8,592,916 (the entire contents of which are incorporated herein by reference) describes a raised source drain fabrication process suitable for the present invention, but other known RSD processes can be used. The '916 patent describes that a lower raised source/drain region is formed on a planar source/drain region of a planar field effect transistor or a surface of a portion of semiconductor fin adjoining a channel region of a fin field effect transistor. In the '916 patent, at least one contact-level dielectric material layer was formed and planarized, and a contact via hole extending to the lower raised source/drain region was formed in the at least one contact-level dielectric material layer. In the '916 patent, an upper raised source/drain region was formed on a top surface of the lower raised source/drain region. In the '916 patent, a metal semiconductor alloy portion and a contact via structure were formed within the contact via hole. In the 916 patent, raised source/drain regions were formed by selectively depositing a semiconductor material on exposed source/drain regions and preferably not deposited on nearby dielectric surfaces. The deposited semiconductor material in the '916 patent, was for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material.

At this point, if needed, the dummy, auxiliary, and supplemental dummy gates (described above) can be fabricated on substrate 38 in the areas shown in FIGS. 3 and 5. U.S. Pat. No. 8,946,030 (the entire contents of which are incorporated herein by reference) describes a suitable dummy gate fabrication process. The '030 patent describes a method for forming a dummy gate from a polycrystalline silicon layer.

At step 3), a first passivation layer 55 such as for example a $SiO_2$ layer or $Si_3N_4$ layer is formed over the existing structures on substrate 38. After the first passivation layer 55 is formed, at step 4) via holes may be etched in the passivation layer to expose the RSDs 40 and 42. These via holes can be filed with a drain metal forming metallizations 29 and 31.

At step 5), prior to, after, or simultaneous with forming the via holes for the metallizations, other vias would be opened in the first passivation layer 55 to expose the underlying silicon of substrate 38. Epitaxial growth of silicon 16a would then fill these vias with the epitaxial silicon growth extending laterally across the top of passivation layer 55. This epitaxially grown material will eventually form silicon 16a for channel 16. U.S. Pat. No. 7,435,639 (the entire contents of which are incorporated herein by reference) describes a silicon epitaxial overgrowth process suitable for the present invention, but other known silicon epitaxial overgrowth processes can be used. In the '639 patent, lateral epitaxial overgrowth proceeded from one or more seed areas in an underlying bulk semiconductor substrate. These overgrown semiconductor layers were grown from the bulk semiconductor substrate and over an insulator layer to form SOI substrates.

At step 6), the silicon 16a on the first passivation layer 55 would then be patterned to leave (on top of the first passivation layer 55) silicon regions for channel 16 and for the formation of RSDs 24 and 35. At steps 7) and 8), RSDs 24 and 35 and the gate structure 8 would be formed on the channel 16. The gate structure may be of many different types, including FinFET, bulk, FDSOI and other types of gates, whether gate-first or gate-last. As one example, the gate stack may include layers of: silicon oxide, high-k dielectric, polysilicon, and then silicide.

At step 9), a second passivation layer 56 would then be formed over components of transistor 2. That is a second passivation layer 56 such as for example a $SiO_2$ layer or $Si_3N_4$ layer is formed over the existing structures of transistor 2 including source structure 6, gate structure 8, and drain structure 10. Following step 9), via holes can then be etched in the second passivation layer 56 to form openings exposing RSDs 24/25 and RSDs 40/42. Reactive ion etching can be used for the etching process to open vias to the metallizations under the first or second passivation layers.

At step 10), suitable metallizations in the etched via holes form metallization connections 28, 29, 30, 31, 32, 33, and 34 as well as metallization connection 22.

Figure 7E:
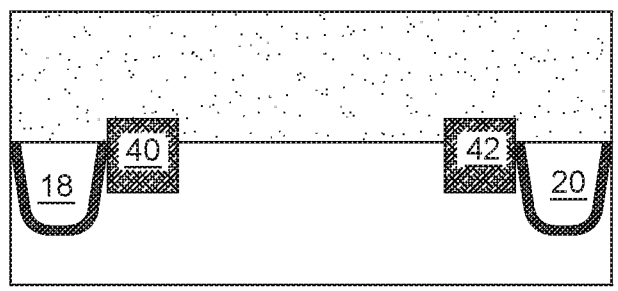
FIGS. 7E-7F are schematics showing an alternative fabrication process for a three dimensional monolithic LVDMOS transistor.
Figure 7E:
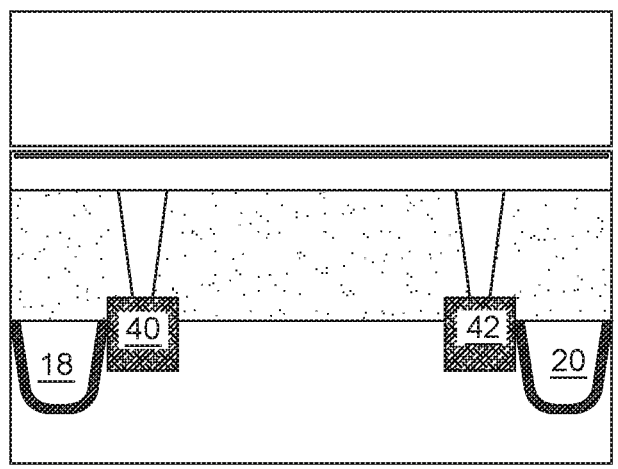
Figure 7F:
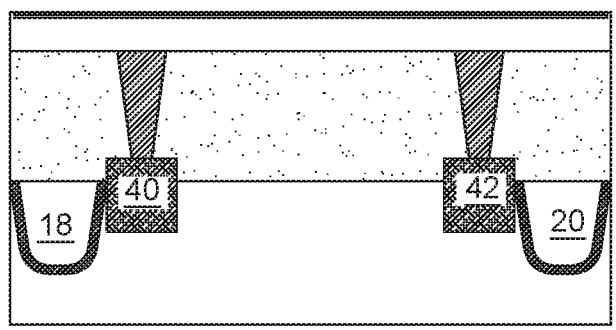
Figure 7F:
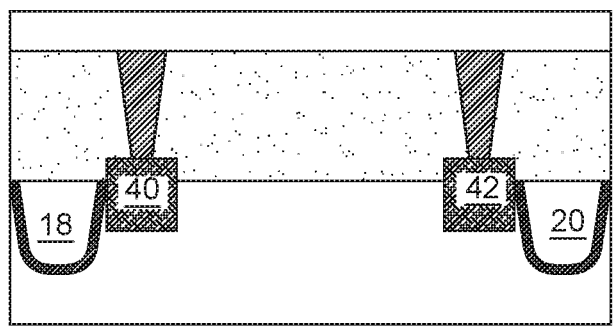

FIG. 7E shows alternative steps that can be used for fabricating the vertically stacked LVDMOS transistor structure of the present invention. Once the first passivation layer is formed over the existing structures on substrate 38, at step 5a), a sacrificial silicon wafer or a silicon on insulator structure is bonded to the first passivation layer 55. Bonding of the silicon on insulator structure or the sacrificial silicon wafer to the first passivation layer 55 may occur by molecular bonding e.g., at a planarized $SiO_2$ insulator boundary at level R.

At step 5b), the bulk support substrate for the silicon on insulator structure is removed by selective etching of the insulator of the silicon on insulator structure. (If a silicon on insulator structure is not used, then the sacrificial silicon wafer once bonded would be thinned to a suitable thickness.) The bonding of the SOI wafer can have a Si thickness between 10 nm to 100 microns. For example, with this approach, layers of silicon 1-100 microns thick could be used. Regardless, the end result is a single crystal silicon layer bonded to the first passivation layer 55.

Figure 7G:
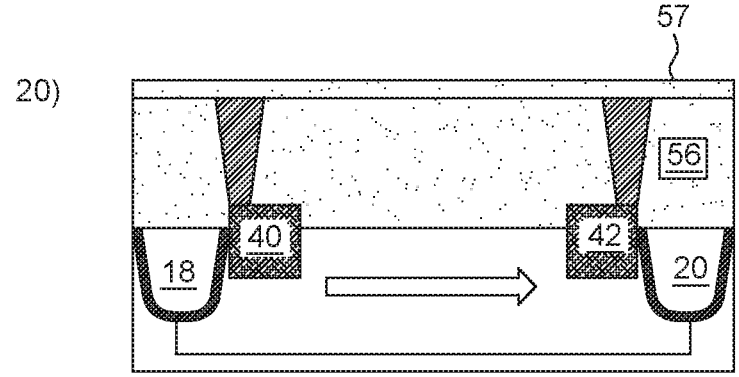
FIGS. 7G to 7I are schematics showing a preferred method for forming and completing the upper stack of the vertically stacked LVDMOS transistor structure of the present invention using a SOI wafer as the source of silicon for the transistor channel.
Figure 7G:
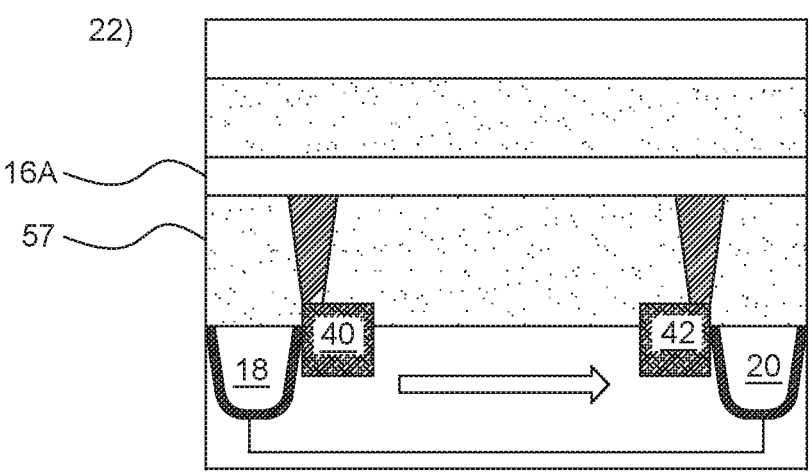
Figure 7H:
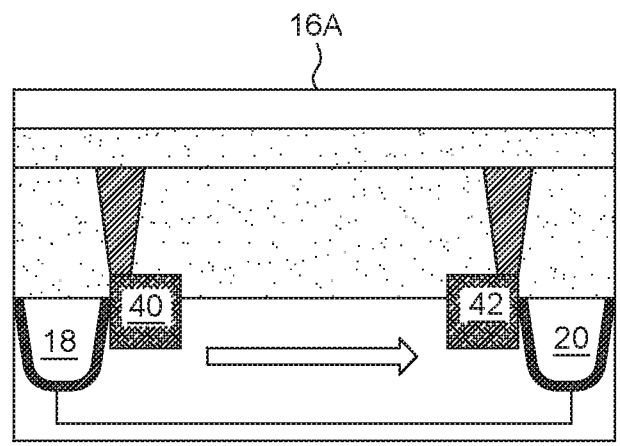
Figure 7H:
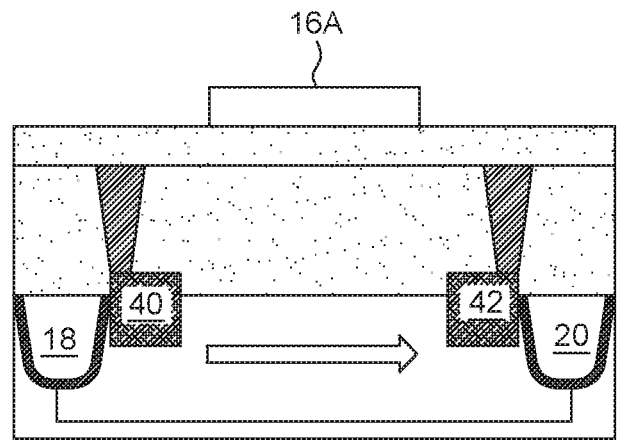
Figure 7I:
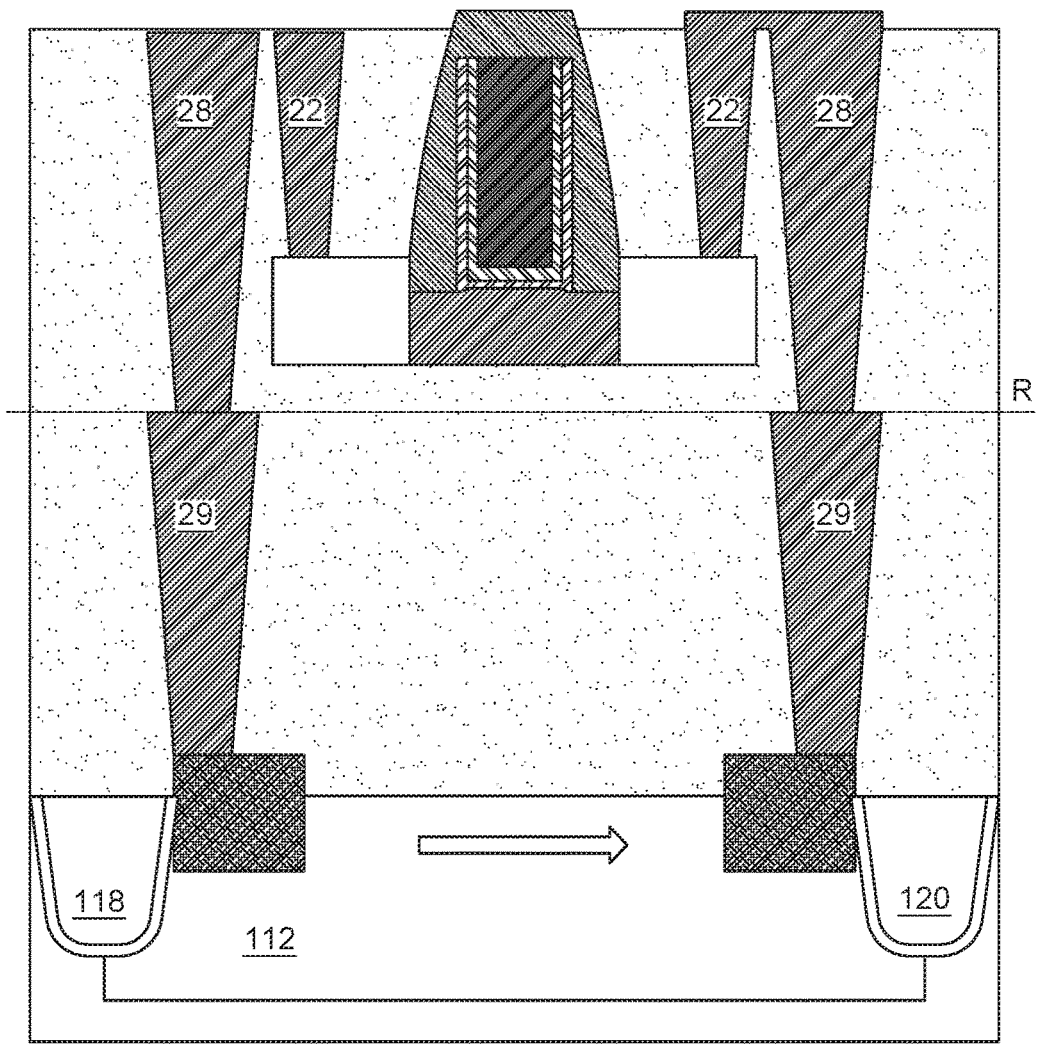

FIGS. 7G to 7I shows a preferred method for forming and completing the upper stack of the vertically stacked LVDMOS transistor structure of the present invention using a SOI wafer as the source of silicon 16a for the transistor channel 16. Once the first passivation layer 55 is formed over the existing structures on substrate 38, at step 20), a layer 57 of $SiO_2$ is formed over the passivation layer 55. At step 22), a SOI wafer is bonded to layer 57, attaching the SOI wafer to the lower stack. As shown in FIG. 7H, at step 24), the oxide and substrate of the SOI wafer is removed, leaving silicon 16a above the lower stack. At step 26), the silicon 16a is patterned. As shown in FIG. 7I, the fabrication process would then proceed as in the other approaches, where the transistor structures would be formed, and the metallization connections made.

Other Embodiments

Many variations of the above-described fabrication processes are possible for production of the vertically stacked LVDMOS transistor structure of the present invention having a drain structure vertically disposed underneath the gate and channel of the transistor. The end result of which is the production of a structure for reducing a drain side voltage of a MOSFET transistor. The drain-voltage-reduction structure has a voltage attenuation structure disposed at a level under the channel region of the MOSFET transistor and includes a pair of electrical contacts spaced apart on a semiconductor substrate and forming (preferably low resistance) ohmic contacts to a conduction path in the semiconductor substrate extending between the pair of electrical contacts. The drain of the MOSFET transistor is connected in series with the conduction path.

More generally, the present invention provides for a structure for voltage shifting control signals of a MOSFET transistor. The structure has a voltage attenuation structure connected in series with a source or a drain (or two voltage attenuation structures: one for the source and one for the drain), disposed apart from the channel region of the MOSFET transistor in a semiconductor substrate, and comprising a pair of electrical contacts spaced apart on the semiconductor substrate which form electrical contacts to a conduction path in the semiconductor substrate extending between the pair of electrical contacts. In this structure, by connecting the drain to a voltage attenuation structure, the voltages across channel 16 can be maintained as per foundries' requirement, permitting for example the channel to operate at normal (safe) range while enduring high voltage at drain.

In this context. "disposed apart" means that the channel region is separated from the semiconductor substrate by at least an insulating layer or structure. While there will be electrical connections between the channel and the semiconducting substrate, the channel and the semiconducting substrate are not in the same monolithic piece, as with conventional LDMOS structures. Accordingly, the location of the semiconductor substrate relative to the MOSFET transistor can be varied. On a single substrate 38, there could be disposed multiple upper stacks of the LVDMOS transistor of the present invention with the substrate 38 and holding many different voltage attenuation structures.

More generally, the present invention also provides for a method for operating a MOSFET transistor at a reduced drain side voltage, comprising: supplying control voltages to a drain and a gate of a transistor switching element of the MOSFET transistor. When the MOSFET transistor is on, conducting drain current through a semiconductor substrate disposed apart from the channel region of the MOSFET transistor and then to the drain of the transistor switching element. In this context, "disposed apart" means that the channel region is separated from the semiconductor substrate by at least an insulating layer or structure. While there will be electrical connections between the channel and the semiconducting substrate, the channel and the semiconducting substrate are not in the same monolithic piece, as with conventional LDMOS structures.

Viewed differently, the present invention also provides for a method for general operation a MOSFET transistor, comprising: supplying control voltages to a source, a drain, and a gate of a transistor switching element of the MOSFET transistor. When the MOSFET transistor is on, conducting current through a semiconductor substrate disposed apart from the channel region of the MOSFET transistor and then to the source or drain of the transistor switching element. In this context, "disposed apart" means that the channel region is separated from the semiconductor substrate by at least an insulating layer or structure. While there will be electrical connections between the channel and the semiconducting substrate, the channel and the semiconducting substrate are not in the same monolithic piece, as with conventional LDMOS structures.

Additionally, in one embodiment of the invention, the vertically stacked configuration of the '710 application with its drain structure vertically disposed above the gate and channel of the transistor is useful as a complementary transistor in a transistor set accompanying the above noted three dimensional LDMOS transistor of the present invention providing a drain structure vertically disposed underneath the gate and channel of the transistor.

Figure 8:
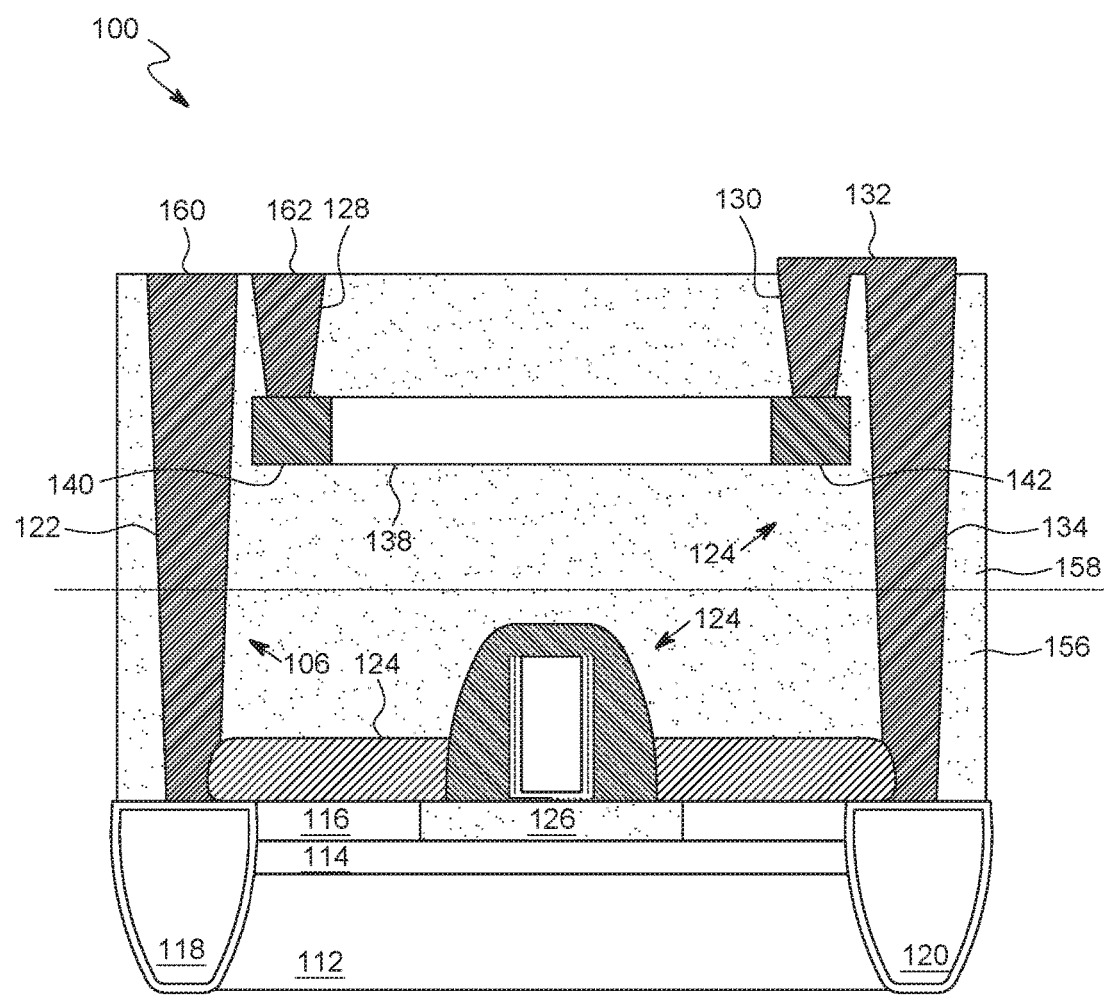
FIG. 8 is a schematic of a three dimensional LDMOS transistor having a drain structure vertically disposed above the gate and channel of a transistor.

FIG. 8 is a schematic of a three dimensional LDMOS transistor 100 of the '710 application shown in a cross sectional view. The transistor 100 includes a source structure 106, a gate structure 108, and a drain structure 110. The transistor 100 is fabricated, in this example, with a fully depleted silicon on insulator (FDSOI) planar processing technology. The FDSOI technology includes a silicon substrate 112, buried oxide (BOX) insulating layer 114, and a thin silicon layer 116 for the active devices. Shallow trench isolation 118 and 118 may separate the transistor 100 from neighboring devices (e.g., additional transistors) formed on the same substrate.

The source structure 106 includes the metallization connection 122 and the raised source/drain (RSD) structure 124. The metallization connection 122 may provide a source terminal 160 or other source signal connection for the transistor 100. The gate structure 108 may be a FDSOI gate, a bulk device gate, a FinFET gate, or any other type of transistor gate structure that creates a channel 126 between the source structure 106 and the drain structure 110.

The drain structure shown in FIG. 8 can include metallization connections 128, 130, 132, and 134, the RSD structure 135, and a voltage attenuation structure 136. The metallization connection 128 may provide a drain terminal or other drain signal connection for the transistor 100 at one end of the voltage attenuation structure 136. In this example, the voltage attenuation structure 136 is a lightly doped drain path 138 ("path 138"). At each end of the lightly doped drain path 138 are highly doped regions 140 and 142, which may, for instance, reduce contact resistance and voltage drop at the interface between the metallization 128, 130 and the voltage attenuation structure 136.

The structures of the transistor 100 are formed at different levels. FIG. 8 shows a reference line 150 to help illustrate the vertically disposed nature of the structures. In particular, the first level 152 includes a source connection (e.g., the RSD 124), a drain connection (e.g., the RSD 135), and the gate structure 108. The second level 154 includes a drain structure (e.g., the voltage attenuation structure 136) vertically disposed above the first level 152 and connected down to the first level 152, e.g., to the RSD 135.

Generalized Statements of the Invention

The following statements of the invention provide one or more characterizations of the present invention and do not limit the scope of the present invention.

Statement 1. A semiconductor device comprising: a first stack of device components comprising a transistor switching element having a channel, a source in contact with the channel, a drain in contact with the channel; and a gate structure at least partially disposed in a space defined between and separating the source and the drain; a source connection to the source, and a drain connection to the drain. The semiconductor device has a second stack of device components disposed underneath the first stack at a lower level than the first stack, and comprising: a semiconductor substrate of a doping type the same as the drain; and a pair of electrical contacts spaced apart on the semiconductor substrate and contacting (i.e., forming ohmic contacts to) a conduction path in the semiconductor substrate extending between the pair of electrical contacts. The drain connection is connected to one of the pair of electrical contacts.

Statement 2. The device of statement 1, wherein said conduction path comprises a path into an interior of the semiconductor substrate. The conduction path can include a path through drain contact regions, which may be raised contact regions. The doping of the contact regions may be between $1\text{-}10 \times 10^{20}$ atoms per $cm^3$. The doping of the contact regions may be between $1\text{-}10 \times 10^{21}$ atoms per $cm^3$.

Statement 3. The device of any of the statements above, wherein said conduction path comprises a path inside a lightly doped region of the semiconductor substrate.

Statement 4. The device of any of the statements above, wherein said lightly doped region has a doping of $1\text{-}10 \times 10^{18}$ atoms per $cm^3$.

Statement 5. The device of any of the statements above, further comprising a shallow trench isolation disposed outside the pair of electrical contacts on the semiconductor substrate.

Statement 6. The device of any of the statements above, further comprising a shallow trench isolation disposed between the pair of electrical contacts on the semiconductor substrate.

Statement 7. The device of statement 6, wherein said conduction path comprises a path under the shallow trench isolation disposed between the pair of electrical contacts on the semiconductor substrate.

Statement 8. The device of any of the statements above, further comprising a floating gate disposed above the semiconductor substrate and between the pair of electrical contacts on the semiconductor substrate.

Statement 9. The device of statement 8, further comprising a supplemental floating gate disposed above the semiconductor substrate and outside the pair of electrical contacts on the semiconductor substrate.

Statement 10. The device of statement 9, further comprising a peripheral shallow trench isolation disposed in the semiconductor substrate and outside the supplemental floating gate.

Statement 11. The device of Claim 8, wherein said conduction path comprises a path under the dummy gate and through the semiconductor substrate.

Statement 12. The device of any of the statements above, further comprising a shallow trench isolation disposed outside the pair of electrical contacts on the semiconductor substrate.

Statement 13. The device of statement 12, further comprising a supplemental floating gate disposed above the semiconductor substrate, inside the shallow trench isolation, and between the pair of electrical contacts on the semiconductor substrate and the shallow trench isolation.

Statement 14. The device of statement 13, further comprising an auxiliary floating gate disposed above the semiconductor substrate, inside the shallow trench isolation, and between the pair of electrical contacts on the semiconductor substrate and the shallow trench isolation.

Statement 15. The device of statement 14, wherein said conduction path in the semiconductor substrate comprises a path between the pair of electrical contacts, under the supplemental floating gate, and under the shallow trench isolation.

Statement 16. The device of any of the statements above, wherein said conduction path in the semiconductor substrate comprises a voltage attenuation structure connected in series with the drain connection. The voltage attenuation structure adds a resistance into the conduction path which reduces a magnitude of a voltage appearing at the drain of the transistor switching element.

Statement 17. The device of any of the statements above, wherein said resistance is 0.5 to 3 (or 1 to 2) times a channel resistance of the channel when the channel is conducting.

Statement 18. The device of any of the statements above, wherein.

Statement 19. A structure for reducing a drain side voltage at a drain of a MOSFET transistor. The structure has a voltage attenuation structure connected in series with the drain, disposed apart from the channel region of the MOSFET transistor in a separate semiconductor substrate, and comprising a pair of electrical contacts spaced apart on the semiconductor substrate which form electrical contacts to a conduction path in the semiconductor substrate extending between the pair of electrical contacts.

Statement 20. The structure of statement 19, having any of the second stack components defined in statements 2-18.

Statement 21. A structure for voltage shifting of a MOSFET transistor. The structure has a voltage attenuation structure connected in series with a source or a drain, disposed apart from the channel region of the MOSFET transistor in a separate semiconductor substrate, and comprising a pair of electrical contacts spaced apart on the semiconductor substrate which form electrical contacts to a conduction path in the semiconductor substrate extending between the pair of electrical contacts.

Statement 22. The structure of statement 21, having any of the second stack components defined in statements 2-18.

Statement 23. A method for operating a MOSFET transistor at a reduced drain side voltage, comprising: supplying control voltages to a drain and a gate of a transistor switching element of the MOSFET transistor. When the MOSFET transistor is on, conducting drain current through a semiconductor substrate disposed apart from the channel region of the MOSFET transistor and then to said drain of the transistor switching element.

Statement 24. The method of statement 23, utilizing any of the second stack components defined in statements 2-18.

Statement 25. A method for operating a MOSFET transistor, comprising: supplying control voltages to a source, a drain and a gate of a transistor switching element of the MOSFET transistor. When the MOSFET transistor is on, conducting current through a semiconductor substrate disposed apart from the channel region of the MOSFET transistor and then to at least one said source or drain of the transistor switching element.

Statement 26. The method of statement 25, utilizing any of the second stack components defined in statements 2-18.

Numerous modifications and variations of the invention are possible in light of the above teachings. It is therefore to be understood that within the scope of the appended claims, the invention may be practiced otherwise than as specifically described herein.

The invention claimed is:

1. A semiconductor device comprising:
a first stack of device components comprising
a transistor switching element having a channel, a source in contact with the channel, a drain in contact with the channel; and a gate structure at least partially disposed in a space defined between and separating the source and the drain;
a source connection to the source, and
a drain connection to the drain; and
a second stack of device components disposed underneath the first stack at a lower level than the first stack, and comprising:
a semiconductor substrate of a doping type the same as the drain; and
a pair of electrical contacts spaced apart on the semiconductor substrate and contacting a conduction path in the semiconductor substrate extending between the pair of electrical contacts,
wherein said drain connection is connected to one of the pair of electrical contacts.

2. The device of claim 1, wherein said conduction path comprises a path into an interior of the semiconductor substrate.

3. The device of claim 1, wherein said conduction path comprises a path inside a lightly doped region of the semiconductor substrate.

4. The device of claim 1, wherein said lightly doped region has a doping of $1\text{-}5 \times 10^{18}$ atoms per $cm^3$.

5. The device of claim 1, further comprising a shallow trench isolation disposed outside the pair of electrical contacts on the semiconductor substrate.

6. The device of claim 1, further comprising a shallow trench isolation disposed between the pair of electrical contacts on the semiconductor substrate.

7. The device of claim 6, wherein said conduction path comprises a path under the shallow trench isolation disposed between the pair of electrical contacts on the semiconductor substrate.

8. The device of claim 1, further comprising a floating gate disposed above the semiconductor substrate and between the pair of electrical contacts on the semiconductor substrate.

9. The device of claim 8, further comprising a supplemental floating gate disposed above the semiconductor substrate and outside the pair of electrical contacts on the semiconductor substrate.

10. The device of claim 9, further comprising a peripheral shallow trench isolation disposed in the semiconductor substrate and outside the supplemental floating gate.

11. The device of claim 8, wherein said conduction path comprises a path under the dummy gate and through the semiconductor substrate.

12. The device of claim 1, further comprising a shallow trench isolation disposed outside the pair of electrical contacts on the semiconductor substrate.

13. The device of claim 12, further comprising a supplemental floating gate disposed above the semiconductor substrate, inside the shallow trench isolation, and between the pair of electrical contacts on the semiconductor substrate and the shallow trench isolation.

14. The device of claim 13, further comprising an auxiliary floating gate disposed above the semiconductor substrate, inside the shallow trench isolation, and between the pair of electrical contacts on the semiconductor substrate and the shallow trench isolation.

15. The device of claim 14, wherein said conduction path in the semiconductor substrate comprises a path between the pair of electrical contacts, under the supplemental floating gate, and under the shallow trench isolation.

16. The device of claim 1, wherein said conduction path in the semiconductor substrate comprises a voltage attenuation structure connected in series with the drain connection.

17. The device of claim 16, wherein said voltage attenuation structure adds a resistance into the conduction path which reduces a magnitude of a voltage appearing at the drain of the transistor switching element.

18. The device of claim 1, wherein said resistance is 0.5-3 times a channel resistance of the channel when the channel is conducting.

19. A structure for reducing a drain side voltage at a drain of a MOSFET transistor, comprising:
a voltage attenuation structure connected in series with the drain, disposed apart from a channel region of the MOSFET transistor in a semiconductor substrate, and including a pair of electrical contacts spaced apart on the semiconductor substrate which form electrical contacts to a conduction path in the semiconductor substrate extending between the pair of electrical contacts, wherein
each of the electrical contacts is a raised structure that extends from a position below a top surface of the semiconductor substrate to a position above the top surface of the semiconductor substrate, and
each of the electrical contacts has a doping concentration that is higher than a doping concentration of the regions of the semiconductor substrate surrounding each of the electrical contacts.

\* \* \* \* \*